(12) United States Patent
Meyer et al.

(10) Patent No.: US 6,278,390 B1
(45) Date of Patent: Aug. 21, 2001

(54) CIRCUIT ARRANGEMENT FOR MONITORING AN OUTPUT LOAD

(75) Inventors: Robert Meyer; Othmar Pfarrkircher, both of Hamburg (DE)

(73) Assignee: U.S. Philips Corporation, New York, NY (US)

(*) Notice: Subject to any disclaimer, the term of this patent is extended or adjusted under 35 U.S.C. 154(b) by 0 days.

(21) Appl. No.: 09/262,101

(22) Filed: Mar. 4, 1999

(30) Foreign Application Priority Data

Mar. 11, 1998 (DE) .............................................. 198 10 469

(51) Int. Cl.⁷ ...................................................... H03M 1/06
(52) U.S. Cl. ............................................. 341/118; 341/144
(58) Field of Search ..................................... 341/118, 120, 341/110, 144, 155; 323/317

(56) References Cited

U.S. PATENT DOCUMENTS 4,928,049 * 5/1990 Pietrobon et al. .................... 318/685
5,825,321 * 10/1998 Park ...................................... 341/144

* cited by examiner

Primary Examiner—Peguy JeanPierre
(74) Attorney, Agent, or Firm—Bernard Franzblau

(57) ABSTRACT

A circuit arrangement for monitoring an output load (4) of a digital-to-analog current converter (1). The digital-to-analog converter supplies an analog output current dependent on a digital comparison data word to a first resistor (2) and, if present, to the output load (4) arranged in parallel with the first resistor. In order to provide a continuous monitoring of the output load, a digital first comparator (12) compares the data words applied to the digital-to-analog current converter (1) with at least one comparison data word. An analog second comparator (5) compares the voltage drop across the first resistor with at least one reference voltage and applies its output signal to a flip-flop (8). A comparison circuit (11) monitors the magnitude and/or the presence of the output load dependent on the output signals of the first comparator and the flip-flop.

23 Claims, 1 Drawing Sheet

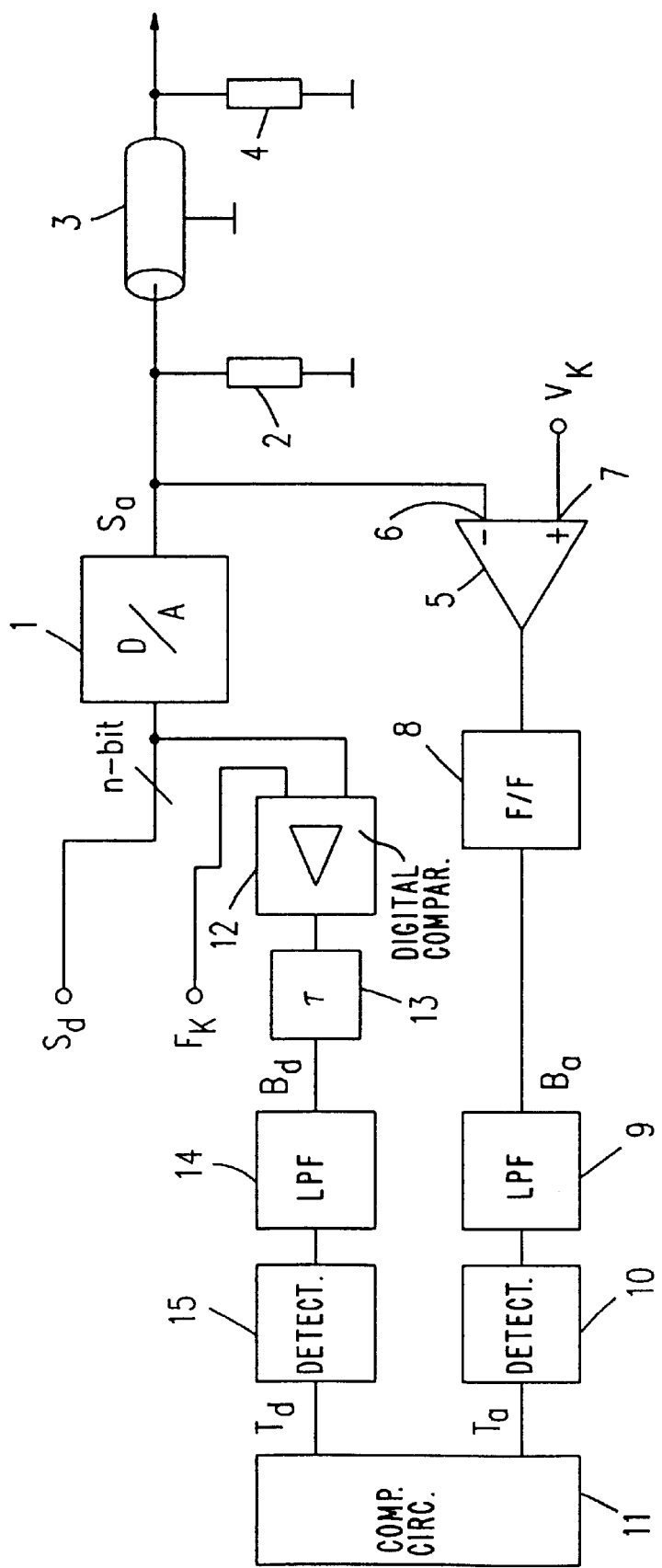
FIG. I

CIRCUIT ARRANGEMENT FOR MONITORING AN OUTPUT LOAD

BACKGROUND OF THE INVENTION

This invention relates to a circuit arrangement for monitoring an output load of a digital-to-analog current converter which supplies an analog output current in dependent on a digital comparison data word, which output current is applied to a first resistor and, if present, the output load arranged in parallel with said first resistor.

In known circuit arrangements of this type the output voltage appearing across the resistor or the resistors is checked only once, generally when the arrangement is switched on, which arrangement can, for example, form a part of a PC. For this purpose, a given data word is applied and the voltage drop across the resistors is compared with a reference voltage. By means of this one-time comparison it is merely possible to detect whether or not the output load is present at that time. Its magnitude cannot be monitored. If the output load is removed during operation of the circuit arrangement, this cannot be detected.

SUMMARY OF THE INVENTION

It is an object of the invention to provide a circuit arrangement of the type defined in the opening paragraph, which enables the output load to be monitored continuously.

According to the invention this object is achieved in that there has been provided a digital first comparator which compares the data words applied to the digital-to-analog current converter with at least one comparison data word. An analog second comparator compares the voltage drop across the first resistor with at least one reference voltage and applier to output signal to a flip-flop. A comparison circuit monitors the magnitude and/or the presence of the output load in dependence on the output signals of the first comparator and the flip-flop.

This circuit arrangement in accordance with the invention makes it possible to carry out a continuous check of the output load, i.e. to monitor continuously whether the output load is present and whether it has the prescribed magnitude.

For this purpose, the data words received by the digital-to-analog current converter during steady operation are applied to a digital first comparator, which compares these data words with a comparison data word. At any time and for every data word this comparison indicates whether this data word is greater or smaller than the comparison data word.

An analog second comparator compares the voltage drop across the first resistor or the parallel arrangement of the two resistors with at least one reference voltage.

The magnitude of the voltage drop depends on whether the external output load is arranged in parallel with the first resistor and whether it has the prescribed magnitude. The comparison of the two voltages by means of the comparator and the conversion of its output signal into a digital signal by means of a flip-flop results in a signal which provides a continuous indication of which of the two voltage values is greater.

Thus, the digital output signals of the digital first comparator and of the flip-flop basically furnish similar information. In the case of the prescribed resistance and a correctly corrected output load, both output signals should yield substantially the same duty cycles, i.e. approximately equal time intervals in which the data words or the output voltage are greater than the comparison values and time intervals in which they are smaller than the comparison values. This processing is effected by means of a digital comparison circuit capable of drawing conclusions about the presence and magnitude of the output load from these duty cycles.

Particularly in order to improve the detection of the magnitude of the output load several data words and reference voltages of different magnitudes can be provided, thus enabling a finer graduation of the digital words and analog voltages to be obtained.

If desired, the comparison described above can be effected continuously during normal operation of the circuit arrangement and of the digital-to-analog current converter, thus enabling the presence and the magnitude of the output load to be monitored continuously by means of the comparison circuit. A removal of the output load can then be detected immediately also during operation of the circuit arrangement. Furthermore, if the circuit arrangement has been put into operation without an output load, it is also possible to immediately detect a correct connection of the output load during subsequent operation. If the circuit arrangement is used, for example, in a personal computer, checking is effected not only during booting of the computer but also during steady operation of the computer.

In the case of the dimensioning used in an embodiment of the invention defined in claim 2 a conclusion about the correct connection and magnitude of the output load can be drawn merely by direct comparison of the duty cycles of the two signals applied to the comparison circuit.

In the further embodiments defined in claims 3, 4 and 5 the signals to be compared can, if required, be preprocessed before they are applied to the comparison circuit. In this way, the signal delay in the digital-to-analog current converter can be compensated for or, if applicable, the signals can be smoothed and a detection of the duty cycles is already possible before the comparison circuit.

The circuit arrangement in accordance with the invention can be used advantageously for the conversion of video signals, for which further embodiments defined in claims 6 and 7 can be used advantageously.

In a further embodiment of the invention defined in claim 8 the result of the detection of the output load can be used to suppress or turn off the output signal of the digital-to-analog current converter. Thus, no output signal is supplied in the absence of the output load.

As is defined in claim 9, this suppression of the output signal can be controlled advantageously by the comparison circuit.

Hereinafter, an embodiment of the invention will be described in more detail by way of example.

BRIEF DESCRIPTION OF THE DRAWING

The single FIGURE of the drawing is a block diagram which shows a circuit arrangement in accordance with the invention which includes a digital-to-analog current converter.

DESCRIPTION OF THE PREFERRED EMBODIMENTS

The digital-to-analog current converter 1 receives n-bit data words $S_d$ at its input side and converts these into the analog domain, which yields an analog output signal $S_a$. The signals $S_d$ and $S_a$ can be, for example, video signals.

The analog signal $S_a$ is applied to a first resistor 2 coupled to a reference potential. If required, the signal is further applied to an external output load 4 via a cable 3, which output load is also coupled to the reference potential.

In the case of, for example, a video signal to be used in a personal computer, the output load 4 should be 75 ohms. If, for example, the first resistor has the same value, this results in an overall output load of 37.5 ohms for which the voltage at the output of the digital-to-analog current converter 1 and the voltage across the resistor 2 or the parallel arrangement of the two resistors reaches a nominal value of, for example, maximum 1 V. When the external output load 4 is removed, only the first resistor of 75 ohms is active, as a result of which the voltage at the output of the digital-to-analog current converter 1 or across this resistor 2 is twice as high as in the case of a correctly connected output load. Since this effect is undesirable, a one-time detection of the output voltage upon starting is effected in accordance with the prior art. Subsequent monitoring is then impossible.

However, as the output load may also be connected or disconnected during operation, the circuit arrangement in accordance with the invention shown in FIG. 1 also permits continuous monitoring of the output load.

For this purpose, the output voltage at the output of the digital-to-analog current converter 1 or the output load across the resistor 2 or the parallel arrangement of the resistors 2 and 4 is applied to an inverting input 6 of an analog comparator 5. A comparison voltage $V_K$ is applied to a non-inverting input of the comparator 5. Thus, the comparator 5 continuously compares the output voltage with the comparison voltage. Depending on this comparison it supplies an output signal, which is converted into a digital yes-or-no signal by means of a digital flip-flop which follows the analog comparator 5. Thus, the output signal of the flip-flop 8 supplies information about whether the voltage drop at the output of the digital-to-analog current converter 1 is greater or smaller than the comparison voltage $V_K$.

The digital signal $B_a$ supplied by the flip-flop is applied to a low-pass filter 9 and then to a detector circuit 10 arranged after the filter, which detector circuit detects the duty cycle of the signal and supplies corresponding digital signals $T_a$ to a digital comparison circuit 11.

Thus, so far the circuit elements 5, 8, 9 and 10 are capable of continuously comparing the output voltage with the comparison voltage and, after conversion into the digital domain and low-pass filtering of the resulting signal, of detecting the respective duty cycles, which enables a direct conclusion to be drawn about the time intervals in which the output voltage is greater than the comparison voltage and those in which it is smaller than the comparison voltage.

Furthermore, there is a digital second comparator 12 having one input to which a fixed data word $F_K$ is applied and having a second input to which the continually changing data word $S_d$ is applied, which is also applied to the digital-to-analog current converter 1. Advantageously, the ratio between the digital maximum value and $F_K$ and between the maximum analog output voltage and $V_K$ are selected to be equal to one another.

The digital second comparator 12 thus continuously compares these two data words and supplies an output signal which continuously provides information about the comparison result. A delay element 13 arranged after the second comparator 12 compensates for the signal delay caused by the digital-to-analog current converter 1. The signal $B_d$ now obtained is applied to a low-pass filter 14 and a detector circuit 15 arranged after this filter in order to detect the corresponding duty cycles. This detector supplies an output signal $T_d$ which, similarly to the signal $T_a$ supplied by the first detector circuit 10, provides information about the ratio between the time intervals in which the digital data word and the analog output signal, respectively, are greater than or smaller than the comparison data word $F_K$ and th comparison voltage $V_K$, respectively.

The signals $T_d$ and $T_a$ are compared by means of the comparison circuit 11. From the instantaneous duty cycles it is possible to infer directly whether the output load is present and whether it has substantially the prescribed magnitude. In an advantageous manner, the magnitudes of the comparison data word $F_K$ and the comparison voltage $V_K$ can be dimensioned in such a way that in the case of a correctly connected output load substantially the same duty cycles occur in the signals $B_d$ and $B_a$ and are indicated by the signals $T_d$ and $T_a$. However, if the output load 4 is removed those time intervals in which the voltage at the output of the digital-to-analog current converter 1 is greater than the comparison voltage increase distinctly in length, so that the comparator 5 supplies a corresponding comparison result, which eventually leads to corresponding duty cycles in the signal $T_a$. However, since this does not cause the signal Td to change, the two signals indicate clearly different duty cycles, which is an indication that the output load has been removed. From the magnitude and sign of the relative deviation of the duty cycles it is possible to derive the magnitude of the deviation and the sign of the deviation of the value of the output load from a nominal value. For example, if the output load is too small, the output voltage across the digital-to-analog current converter 1 drops further than would be the case for a normal output load, as a result of which the voltage is smaller than the comparison voltage for longer time intervals. The signal $T_a$ yields corresponding results from which this change can be inferred.

If desired, several comparison data words $F_K$ and comparison voltages $V_K$ can be compared for a higher accuracy. This makes it possible to detect the voltage ratios more accurately.

In any case, the circuit arrangement makes it possible by a continuous comparison of the digital words and the analog output voltage to detect at any time whether the output load 4 is connected and has substantially the correct magnitude.

The circuit arrangement can advantageously utilize a plurality of comparison data words and associated reference voltages. Thus, it is possible to compare negative and positive deviations from a plurality of amplitude values in both signals with one another and to evaluate the corresponding duty cycles. This allows an even more accurate monitoring of the output voltage.

The circuit arrangement can also be used to set the output amplitude of the digital-to-analog current converter 1 as desired. For this purpose, the comparison data word is applied and compared with the reference voltage. The output amplitude of the digital-to-analog current converter the has the correct setting if substantially equal duty cycles are obtained when the two signals are evaluated.

The circuit arrangement can also be used for monitoring the signal bandwidth of the output signal $S_a$ or for monitoring an extraneous feed-in of an external signal through the output load.

In order to monitor such an extraneous feed-in the output of the digital-to-analog current converter 1 is internally switched to a high-impedance state. By means of the analog comparator it is measured whether a signal which is not equal to a constant low appears. If this is not the case, this means that a signal is fed in from the output or the output load, i.e. an extraneous feed-in occurs.

What is claimed is:

1. A circuit arrangement for monitoring an output load of a digital-to-analog current converter which supplies an analog output current dependent on a digital comparison data word, means for applying the output current to a first resistor and, if present, the output load coupled in parallel with said first resistor, characterized in that a digital first comparator compares the data words applied to the digital-to-analog current converter with at least one comparison data words, an analog second comparator compares a voltage drop across the first resistor with at least one reference voltage and applies its output signal to a flip-flop, and a comparison circuit monitors the magnitude and/or the presence of the output load dependent on the output signals of the first comparator and the flip-flop.

2. A circuit arrangement as claimed in claim 1, wherein comparison data word and the reference voltage are dimensioned in a manner such that substantially equal duty cycles occur in the output signals of the first comparator and the flip-flop when the output load is connected.

3. A circuit arrangement as claimed in claim 1, wherein comparison circuit is preceded by respective filters which subject the respective signals applied to the comparison circuit to a low-pass filtering.

4. A circuit arrangement as claimed in claim 1, wherein comparison circuit is preceded by respective detector circuits which detect the instantaneous duty cycles of the respective signals applied to the comparison circuit and supplies them to the comparison circuit.

5. A circuit arrangement as claimed in claim 1, wherein output signal of the digital first comparator is passed through a delay element which compensates for the signal delay in the digital-to-analog current converter.

6. A circuit arrangement as claimed in claim 1, wherein digital-to-analog current converter is adapted to convert a video signal, the first resistor has a resistance value of 75 ohms, the output load has a nominal resistance of 75 ohms, and the comparison data word and the reference voltage are dimensioned in a manner such that for said resistance value of the output load the signals applied to the comparison circuit have substantially equal duty cycles.

7. A circuit arrangement as claimed in claim 1, wherein output load is a computer monitor having a resistance value of approximately 75 ohms.

8. A circuit arrangement as claimed in claim 1, wherein comparison circuit controls the circuit arrangement in a manner such that it supplies no output signal if no output load (4) has been detected for a given time interval.

9. A circuit arrangement as claimed in claim 1, wherein the comparison circuit controls the circuit arrangement in a manner such that it does not supply an output signal in the case of an output load whose resistance value deviates by a given value from that of the nominal resistance value of the output load.

10. A circuit arrangement as claimed in claim 1, wherein which provides a plurality of associated comparison data words and reference voltages at a time.

11. The circuit arrangement as claimed in claim 1 wherein the output load comprises a computer graphics circuit.

12. The circuit arrangement as claimed in claim 1 used for controlling the output amplitude of the digital-to-analog current converter.

13. The circuit arrangement as claimed in claim 1 used for monitoring the bandwidth of the output signal of the digital-to-analog current converter.

14. The circuit arrangement as claimed in claim 1 used for monitoring an external signal which is possibly fed in through the output load.

15. An apparatus for continuously monitoring an output load, the apparatus comprising:

an input terminal for receipt of a digital data word signal, an output terminal for connection to the output load, a digital-to-analog current converter having an input coupled to the input terminal and an output coupled to the output terminal, a resistor coupled to the output terminal, a digital comparator having a first input coupled to said input terminal and a second input that receives at least one digital comparison data word, an analog comparator having a first input coupled to the output terminal and a second input coupled to a source of reference voltage, a flip-flop coupled to an output of the analog comparator, and a comparison circuit having input means coupled to respective outputs of the digital comparator and the flip-flop thereby to continuously monitor the output load dependent upon output signals of the digital comparator and the flip-flop.

16. The continuous monitoring apparatus as claimed in claim 15 wherein the digital data word signal and the reference voltage are arranged to produce output signals of the digital comparator and the flip-flop having substantially equal duty cycles when a nominal output load is connected to the output terminal.

17. The continuous monitoring apparatus as claimed in claim 15 further comprising first and second low pass filters coupled between the respective outputs of the digital comparator and the flip-flop and the input means of the comparison circuit.

18. The continuous monitoring apparatus as claimed in claim 15 further comprising first and second detectors coupled between the respective outputs of the digital comparator and the flip-flop and the input means of the comparison circuit, wherein said first and second detectors are operative to detect the instantaneous duty cycles of the respective signals received from the respective outputs of the digital comparator and the flip-flop.

19. The continuous monitoring apparatus as claimed in claim 15 further comprising a delay element coupled between the output of the digital comparator and the input means of the comparison circuit for compensating for a signal delay introduced in the digital-to-analog current converter.

20. The continuous monitoring apparatus as claimed in claim 15 wherein the resistance of said resistor is equal to the nominal resistance value of the output load, and the digital data word and the reference voltage are chosen so that for an output load of the nominal resistance value the respective signals applied to the input means of the comparison circuit have substantially equal duty cycles.

21. The continuous monitoring apparatus as claimed in claim 15 wherein the comparison circuit controls the monitoring apparatus so that it does not supply an output signal for an output load whose resistance value deviates by a given amount from that of its nominal resistance value.

22. The continuous monitoring apparatus as claimed in claim 15 wherein the comparison circuit controls the monitoring apparatus so that it does not supply an output signal if no output load is detected for a given time interval.

23. The continuous monitoring apparatus as claimed in claim 15 wherein the value of the reference voltage is set by the value of an output voltage at the output terminal for an output load of nominal resistance value.

* * * * *